United States Patent
Gravermann et al.

(10) Patent No.: US 10,338,103 B2
(45) Date of Patent: Jul. 2, 2019

(54) VOLTAGE SENSING DEVICE

(71) Applicant: 3M INNOVATIVE PROPERTIES COMPANY, St. Paul, MN (US)

(72) Inventors: Mark Gravermann, Erkelenz (DE); Gunther A. J. Stollwerck, Krefeld (DE); Michael H. Stalder, Uedem (DE); Hermanus Franciscus Maria van Meijl, Someren-Eind (NL); Jens Weichold, Erkelenz (DE); Benjamin Muenstermann, Duisburg (DE)

(73) Assignee: 3M Innovative Properties Company, St. Paul, MN (US)

( * ) Notice: Subject to any disclaimer, the term of this patent is extended or adjusted under 35 U.S.C. 154(b) by 65 days.

(21) Appl. No.: 15/510,832

(22) PCT Filed: Sep. 25, 2015

(86) PCT No.: PCT/US2015/052290
§ 371 (c)(1),
(2) Date: Mar. 13, 2017

(87) PCT Pub. No.: WO2016/053790
PCT Pub. Date: Apr. 7, 2016

(65) Prior Publication Data
US 2017/0234908 A1    Aug. 17, 2017

(30) Foreign Application Priority Data

Sep. 30, 2014 (EP) .................................. 14187151

(51) Int. Cl.
*G01R 19/00* (2006.01)
*G01R 15/06* (2006.01)
*G01R 15/16* (2006.01)

(52) U.S. Cl.
CPC ............. *G01R 15/06* (2013.01); *G01R 15/16* (2013.01); *G01R 19/0084* (2013.01)

(58) Field of Classification Search
CPC ..... G01R 15/16; G01R 15/06; G01R 19/0084
(Continued)

(56) References Cited

U.S. PATENT DOCUMENTS 3,657,650 A * 4/1972 Arndt .................. G01R 19/145
                                                                174/18
3,772,122 A    11/1973 Young
(Continued)

FOREIGN PATENT DOCUMENTS

EP           2696206        2/2014
WO    WO 2006-058965       6/2006
(Continued)

OTHER PUBLICATIONS

International Search Report for PCT International Application No. PCT/US2015/052290 dated Dec. 21, 2015, 5 pages.

*Primary Examiner* — Patrick Assouad
*Assistant Examiner* — Demetrius R Pretlow
(74) *Attorney, Agent, or Firm* — Gregg H. Rosenblatt

(57) ABSTRACT

The invention relates to a voltage sensing device (1) for a high and/or medium voltage power carrying conductor (2), the voltage sensing device comprising: a radially outer electrode (3) operable as a first sensing electrode of a sensing capacitor for sensing the voltage of the power carrying conductor; a radially inner electrode (2, 6) operable as a second sensing electrode of the sensing capacitor; a dielectric material (5) arranged between the inner and the outer electrode (3, 2, 6), wherein the coefficient of thermal expansion of the material of at least one electrode (3, 2, 6) is selected such that it compensates the temperature dependent parameters of the dielectric material (5) and/or the other
(Continued)

Figure 1:
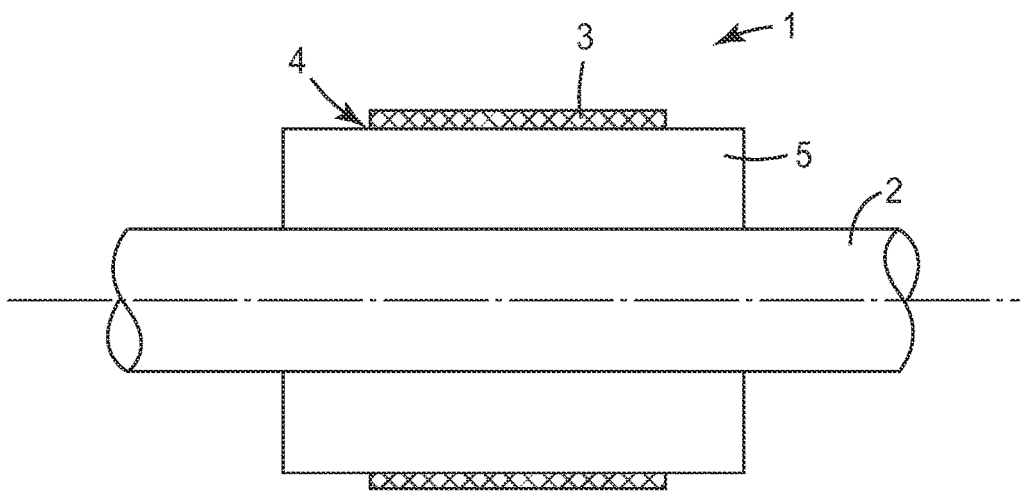

electrode (3, 2, 6), that influences the capacity of the voltage sensing capacitor.

15 Claims, 4 Drawing Sheets

(58) Field of Classification Search
USPC .......................................................... 324/126
See application file for complete search history.

(56) References Cited

U.S. PATENT DOCUMENTS

| | | | |
|---|---|---|---|
| 4,052,668 A | 10/1977 | Schmitt | |
| 4,292,610 A | 9/1981 | Makimoto | |
| 4,460,739 A | 7/1984 | Ashby | |
| 4,963,819 A * | 10/1990 | Clarke | G01R 15/16 |
| | | | 174/73.1 |
| 5,473,244 A * | 12/1995 | Libove | G01R 1/22 |
| | | | 324/126 |
| 5,991,177 A | 11/1999 | Kaczkowski | |
| 9,778,294 B2 * | 10/2017 | Iida | G01R 19/175 |
| 2006/0020671 A1 | 1/2006 | Pike | |
| 2007/0241843 A1 | 10/2007 | D'Ostilio | |
| 2007/0285089 A1 * | 12/2007 | Ibuki | G01R 15/181 |
| | | | 324/260 |
| 2010/0283487 A1 * | 11/2010 | Juds | G01R 15/16 |
| | | | 324/688 |
| 2014/0015516 A1 * | 1/2014 | Sorensen | G01R 19/00 |
| | | | 324/127 |
| 2014/0021965 A1 | 1/2014 | De Rybel | |
| 2014/0062459 A1 | 3/2014 | El-Essawy | |
| 2014/0354302 A1 * | 12/2014 | Lu | G01R 19/0084 |
| | | | 324/658 |

FOREIGN PATENT DOCUMENTS

| | | |
|---|---|---|
| WO | WO 2012-052584 | 4/2012 |
| WO | WO 2014-120792 | 8/2014 |

\* cited by examiner

VOLTAGE SENSING DEVICE

The invention relates to a voltage sensing device for a high and/or medium voltage carrying conductor. In particular, it relates to a voltage sensing device for high and/or medium voltage carrying conductors, such as a cable in a power distribution network. The invention also relates to a cable connector that can be used with a sensor according to the invention and to a cable accessory that comprises a sensor according to the invention.

Operators of electrical power networks monitor the state of their network using sensors for voltage and current on their installations and on individual cables. An example of a high voltage capacitor suitable for measuring the voltage of an overhead power line is disclosed in U.S. Pat. No. 4,963,819. The capacitor's dielectric is mounted directly on to the power line conductor, which serves as one electrode of the capacitor. The other electrode of the capacitor is mounted onto the outer surface of the dielectric and is protected at each side by a guard ring. Stress control is provided between the outer capacitor electrode and the guard ring and also at the outer edges of the guard rings. The capacitor may be enclosed in an earthed housing, which can contain one or more current transformers.

US 2006/020671 A1 discloses a voltage sensor with primary and secondary capacitances of a voltage divider being molded into a solid dielectric material. The capacitances are preferably fabricated by coating and made from the same material, or at least materials having nearly identical temperature coefficients of permittivity.

WO 2012/052584 A1 discloses a voltage measuring device that comprises an element configuring an electric field between a power carrying conductor and a structure. The element configuring the electric field includes a body of insulating material having dielectric properties that are not affected by temperature variations.

And finally DE 24 13 927 A1 discloses a high voltage capacitor suitable for measuring the voltage of a power line. The system comprises an auxiliary capacitor as part of an evaluation device, which generates a signal corresponding to capacitance changes of the auxiliary capacitor resulting from external influences.

The EP 0 869 369 A2 discloses a capacitive voltage divider for high voltage environment. The capacitive voltage divider comprises a correction device for compensating temperature dependent behavior of the components of the voltage divider. The correction device actively compensates temperature dependent behavior based on data of experiments made.

In view of the prior art, there is still the need to provide a voltage sensing device for a high and/or medium voltage power carrying conductor that is simple and therewith cost effective to produce and that provides a certain amount of accuracy.

The present invention addresses this problem. It provides a voltage sensing device for a high and/or medium voltage power carrying conductor, the voltage sensing device comprising:
  a radially outer electrode operable as a first sensing electrode of a sensing capacitor for sensing the voltage of the power carrying conductor;
  a radially inner electrode operable as a second sensing electrode of the sensing capacitor;
  a dielectric material arranged between the inner and the outer electrode, wherein the coefficient of thermal expansion of the material of at least one electrode is selected such that it compensates the temperature dependent parameters of the dielectric material and/or the other electrode that influences the capacity of the voltage sensing capacitor.

Generally, a voltage sensing device according to the present invention may be comprised in a capacitive voltage sensor assembly. The radially outer electrode, the radially inner electrode and the dielectric material arranged between the electrodes are operable as a sensing capacitor. The sensing capacitor may be comprised in the voltage sensor assembly. The voltage sensor assembly may further comprise a secondary capacitor. The sensing capacitor and the secondary capacitor may be connected in series such as to form a capacitive voltage divider. The capacitive voltage divider may be operable to sense a voltage of the power-carrying conductor, such as an inner conductor of the power cable or a cable connector or a bus bar. The sensing capacitor according to the invention may also be used in other known electrical circuits, e.g. as a galvanic decoupling element of an operational amplifier (OP AMP).

In operation, the components of a voltage sensor assembly get heated due to a current flowing through the power carrying conductor. Typical temperature ranges may be between −10° C. and +90° C. or more. Due to these changes of temperature the materials used for the voltage sensing device may change their dimensions and other properties such as the relative permittivity. The materials may expand when they get heated and/or their relative permittivity may change. This change in the dimensions and/or relative permittivity influences the capacity of the sensing capacitor, which usually has a not negligible temperature gradient.

The temperature dependency of the capacity can for example be calculated with the following formula (only valid for cylindrically shaped capacitors; if other forms of capacitors are used, then the according formula needs to be used):

$$C = 2\pi \varepsilon_0 \varepsilon_{rel} * l \ln R_{out}/R_{in}$$

wherein
C: is the capacity of the sensing capacitor
$\varepsilon_{rel}$: is the relative permittivity of the dielectric material between the two electrodes
l: is the length of the sensing capacitor
$R_{out}$: is the radius of the radially outer electrode of the sensing capacitor
$R_{in}$: is the radius of the radially inner electrode of the sensing capacitor
$\varepsilon_{rel}$, l, $R_{out}$ and $R_{in}$ may be temperature dependent.

The above described temperature dependency may lead to a loss in the accuracy of the voltage sensor assembly with changing temperatures. The present invention seeks to address this problem by selecting the material of at least one electrode of the voltage sensing device such that it compensates the temperature dependent behaviors or parameter of the other electrode and/or the dielectric material. In other words, by selecting e.g. a material for the radially outer electrode which for example keeps its geometry within the above mentioned temperature ranges, it might be possible to prohibit that the distance between the inner and the outer electrode changes with the temperature. With such an embodiment, the dielectric material might be held within the borders of the outer electrode and therewith keep the distance to the inner electrode essentially constant even when the temperature changes. Another way to explain the principle of the invention is that the radially outer electrode needs to fulfil the two following requirements:

a) It needs to be electrically conductive in order to e operable as a sensing electrode of the sensing capacitor; and
b) It needs to be mechanically or geometrically stable with changing temperatures within the above mentioned temperature ranges, or at least it needs to be stable enough to prohibit an expansion of the dielectric material.

It is also possible to influence the capacity of the voltage sensing device by selecting an appropriate material for the inner electrode. An expansion towards the side of the voltage sensing device, e.g. the opening between the radially outer and the radially inner electrode may for example be prohibited or suppressed, when the dielectric material is securely fixed to either the radially inner and/or the radially outer electrode. This may for example be achieved by a big enough static friction between the electrode(s) and the dielectric material or by using an appropriate bonding or adhesive agent between the dielectric material and one or both electrodes.

An additional way to optimize the accuracy of the voltage sensing device is to also consider the temperature dependency of the dielectric coefficient of the dielectric material when selecting a material for the inner or the outer electrode.

The radially outer electrode may comprise any kind of electrically conductive material that is able to fulfill the requirements of claim 1, according to which the coefficient of thermal expansion of the material of the outer electrode has to be selected such that it compensates the temperature dependent behaviors of the other electrode and/or the dielectric material. It is also possible that the radially outer electrode comprises a non-conductive core part that is coated with a conductive material. It is beneficial for the invention if the tensile module of the radially outer electrode is significantly higher than the elastic modules of the dielectric material. With such a configuration the dimensions of the radially outer electrode do not get affected by any expansion due to a temperature rise of the dielectric material. Examples for such materials are Boron nitride, Aluminum, Copper, steel and/or alloys comprising any of these materials. The electrode may comprise an electrically conductive polymer as well.

The radially outer electrode may extend around the power carrying conductor at least partially in such a way that its inner surface is directed towards the radially inner conductor. If the outer electrode extends entirely around the power carrying conductor, it may comprise a cylindrical shape. In other words, the outer electrode may have a straight profile in an axial longitudinal sectional view of the voltage sensing device, such that all portions of its inner surface are radially equally close to a central axis of the power carrying conductor. A straight profile may be advantageous for keeping the overall size of the voltage sensing device small, and it may be particularly cost effective to manufacture. All other shapes are possible as well, ideally depending on the shape of the power carrying conductor, such as for example a square or rectangular shape or a sector shape. If the radially outer electrode does not extend entirely around the power carrying conductor, additional means for holding the electrode in its position relative to the radially inner electrode need to be arranged within the voltage sensing device.

Independent of other features, the radial thickness of the radially outer electrode may—depending on the material used—be between 1 and 6 mm, preferably between 1 and 3 mm.

The radially inner electrode may comprise any kind of electrically conductive material that is able to fulfill the requirements of claim 1, according to which the coefficient of thermal expansion of the material of at least one electrode has to be selected such that it compensates the temperature dependent behavior or parameter of the other electrode and/or the dielectric material. Examples for such materials are copper, steel, nickel, aluminum, or an alloy comprising any of these materials. It is also possible that the radially inner electrode comprises a non-conductive core part that is coated with a conductive material. The electrode may comprise an electrically conductive polymer as well.

The radially inner electrode may either be the power carrying conductor itself or it may be an additional element that extends around the power carrying conductor at least partially in such a way that its outer surface is directed towards the radially outer electrode. If it extends entirely around the power carrying conductor it may comprise a cylindrical shape. In other words, the radially inner electrode may have a straight profile in an axial longitudinal sectional view of the voltage sensing device, such that all portions of the inner surface of the radially inner electrode are radially equally close to a central axis of the power carrying conductor. A straight profile may be advantageous for keeping the overall size of the voltage sensing device small, and it may be particularly cost effective to manufacture. All other shapes, as for example the shapes listed above for the radially outer electrode are possible as well.

Thickness of inner electrode can be as high as the diameter of the electrode in case of the conductor being the inner electrode. A separate inner electrode has a thickness of 0.5 mm to 3 mm, preferably, 1 mm to 2 mm.

The two electrodes may comprise the same axial length and/or may be arranged in the same axial position. It is also possible that they differ in length and/or have a different axial position relative to each other. According to one embodiment of the invention is the radially inner electrode longer in an axial direction as the radially outer electrode. They may be centered relative to each other such that the radially inner electrode extends on both ends of the outer electrode. The two electrodes may be arranged relative to each other in a symmetrical way.

The dielectric material arranged between the inner and the outer electrode can be any material with dielectric properties, such as for example Silicone, Polyurethan, High Module Ethylene Propylene Rubber), cross-linked Polyethylene or Epoxy Resin. Due to the idea of the invention it is even possible to select a material for the dielectric material with a high coefficient of thermal expansion, because this feature will be compensated by the temperature dependent or parameter behavior of at least one electrode. This provides the possibility to select materials that have a reasonable price. The radially thickness of the dielectric material depends on the material used and may for example be between 6 and 14 mm.

The power carrying conductor may be a cable connector, such as a cable connector for a medium voltage or a high voltage power cable. The cable connector may be adapted to receive an inner conductor of a power cable. It may be adapted for mating, e.g. releasably or permanently, with the power carrying cable or it may be adapted for mating with a cable adapter attached to the power carrying cable. The cable connector may be at least partially electrically conductive. It may comprise a conductive surface or a conductive surface portion. The cable connector may comprise a receiving portion for receiving parts of the voltage sensing device according to the invention, e.g. parts of the radially inner electrode and/or a contact element arranged between the radially inner electrode and the power carrying conductor.

The power carrying conductor may also be a bus bar. A bus bar may have a rectangular cross section.

The voltage sensing device according to the present invention with a radially inner, a radially outer electrode and a dielectric material in between the radially inner and outer electrode may have a tubular shape. In other words, it may have a passageway extending through the voltage sensing device. A tubular shaped voltage sensing device may have a shape of a hollow cylinder. It may have the shape of a ring, i.e. of a short tube. The sensing device may have the shape of a bent or distorted tube. The voltage sensing device may have the shape of a rectangle. As already explained above, the voltage sensing device according to the invention may either extend completely around the power conductor or it may extend partially around the power carrying conductor.

According to one embodiment of the invention the radially inner electrode comprises a portion of the power carrying conductor. In other words, the power carrying conductor is operable as the radially inner electrode and the sensing capacitor according to the invention comprises a radially outer electrode, a radially inner electrode, which is the power carrying conductor itself and a dielectric material. This embodiment is very cost effective, because only two additional components besides the power carrying conductor are needed to build a voltage sensing capacitor, e.g. the radially outer electrode and the dielectric material between the radially outer electrode and the power carrying conductor. Thus, the power carrying conductor fulfills two purposes, one is acting as a conductor and one is acting as an electrode of a capacitor.

In this embodiment the material of the radially outer electrode needs to be selected such as to compensate the temperature dependency of the relative permittivity of the dielectric material and/or the temperature dependency of the thermal coefficient of expansion of the power carrying conductor.

According to another embodiment the inner electrode comprises a separate electrode element—electrically connected to the power carrying conductor—which is placed between the power carrying conductor and the radially outer electrode. With this embodiment it may be possible to set up a system that is independent of the thermal behavior of the power carrying conductor. In such a system it may be easier to adapt the materials to each other such that the temperature dependencies can be compensated. Thus, such a system may provide an even higher accuracy as the systems described before.

According to another embodiment either one or both electrodes are arrangeable around the power carrying conductor. For such a configuration both electrodes may comprise a passageway, which passageway may receive the power carrying conductor. The axial passageway may be adapted to the shape of the power carrying conductor, e.g. it may for example comprise a rectangular, a triangular or any angular, an elliptic, an oval or a round or circular cross section.

According to another embodiment the coefficient of thermal expansion of the materials of the radially outer and the radially inner electrode are selected such that they compensate the temperature dependent parameters of the dielectric material and/or the other electrode, that influences the capacity of the voltage sensing device. As already pointed out above, the temperature dependency of the capacity is given by the temperature dependency of $\varepsilon_{rel}$, $R_{out}$, $R_{in}$ and $l$. The temperature dependency of $\varepsilon_{rel}$ is due to the decreasing density with temperature of the dielectric material. The temperature dependency of $R_{out}$, $R_{in}$ and $l$ is due to the thermal expansion of the materials of the electrodes. By selecting the materials of the radially outer and the radially inner electrode those dependencies can be influenced and, if a certain material combination is selected, even compensated. Even if a dielectric material with a high temperature dependency is selected, which is usually much more affordable than dielectric materials with a low temperature dependency, it is possible to achieve a high level of accuracy. By using the radially inner and the radially outer electrode to adapt or calibrate the system, more parameters can be selected and adapted, which makes it easier to provide a voltage sensing device with a relatively high accuracy by using relatively cost effective material combinations.

According to another embodiment of the invention the radially inner and the radially outer electrode are made out of the same material. If the material for the radially outer and the radially inner electrode is selected such that it is the same, they behave equal with a change of temperature, which leads to the fact that the distance between the electrodes remains essentially the same with changing temperatures. This contributes to a higher accuracy, since the capacity of the sensing capacitor only depends on $\varepsilon_{rel}$—the dielectric coefficient of the dielectric material between the electrodes and $l$—the length of the sensing capacitor. Such an embodiment may have an advantage regarding the costs, since a smaller number of different materials need to be handled during the production process.

According to another embodiment of the invention the radially inner electrode is made out of a material with a higher coefficient of thermal expansion than the coefficient of thermal expansion of the material of the radially outer electrode. If two different materials with two different coefficients of thermal expansion are selected it is possible to also compensate the above mentioned parameters $\varepsilon_{rel}$—the relative permittivity of the dielectric material between the electrodes and $l$—the length of the sensing capacitor. Therefore this embodiment may provide an even higher accuracy with changing temperatures than the above described embodiment, where both electrodes comprise the same material.

According to another embodiment a contact element may be arranged between the power carrying conductor and the radially inner electrode. If the inner electrode is a separate electrode element arranged between the power carrying conductor and the radially outer electrode, it is necessary to electrically connect the inner electrode with the power carrying conductor. This can either be done with the inner electrode being a separate electrode element and directly contacting the power carrying conductor. Another possibility is to use an additional contact element arranged between the power carrying conductor and the radially inner electrode. Providing an additional contact element between the conductor and the radially inner electrode is advantageous, because the radially inner electrode gets de-coupled from thermal expansion of the power carrying conductor. This may provide the possibility of building a sensing capacitor with a lower temperature dependency and therewith a higher accuracy.

The contact element should ideally be mechanically reliable and should withstand mechanical forces that might stem from relative movement of the sensor with respect to the power carrying conductor. It should also withstand mechanical forces that might originate from different thermal expansion of the radially inner electrode on the one hand, and of the power carrying conductor on the other hand. Such a contact element should further take as little space as possible, so that the sensor can have a small size. The contact element may provide a short electrical path between the power carrying conductor and the radially inner electrode. The contact element may comprise a resilient portion, which may provide for an automatic contact between the power carrying conductor and which may also compensate different thermal expansion of the radially inner electrode and the power carrying conductor. The resilient portion may also provide sufficient contact pressure for a reliable mechanical and electrical contact. The contact element can also be resiliently supported or consist of resilient material.

The contact element may comprise elastomeric material. The elastomeric material may be electrically conductive or it may have an electrically conductive surface. It may be arranged on an outer surface of the power carrying conductor or on a surface of the inner electrode facing the power carrying conductor.

According to another embodiment of the invention the voltage sensing device comprises at least one electrically grounded stress control element arranged adjacent to at least one edge of the radially outer electrode. Depending on the shape of the radially outer and/or the radially inner electrode, the stress control elements may comprise any of the above described shapes of the radially outer electrode, e.g. it may be ring shaped. It may entirely extend around the cable or they may partially extend circumferentially around the cable. The stress control element may provide two benefits. One is to control and influence the electrical field lines at the edges of the sensing capacitor, especially the radially outer electrode, such that the risk for a breakdown between the electrodes is lowered.

According to another embodiment the outer edges of the radially inner and/or outer electrode are shaped such as to minimize the strength of the electrical field in that area. One possibility is to provide the edges of the electrodes with a round or curved shape. A curved profile may be advantageous in order to reduce the risk of electrical breakdown between the two electrodes. A curved profile of the outer electrode for example, as taken in an axial longitudinal section of the sensor, may operate as a geometrical stress control. The curved shape may reduce field concentration at an edge of the radially outer electrode. The same principle is true for the radially inner electrode. The edges of the radially inner and/or outer electrode may provide any known shape that reduces the risk of an electrical breakdown, e.g. a shape according to a Rogowski profile. Applying this measure of curving to the outer electrode and/or the inner electrode may allow to reduce the spacing between the electrodes. This in turn may save space and may allow the sensor to be smaller in size.

According to another embodiment of the invention the voltage sensing device provides a printed circuit board with a low voltage capacity arranged on and electrically contacted with the radially outer electrode. The electrical connection between the PCB and the radially outer electrode may be established with all known methods. The PCB may carry all known and appropriate circuits such as for example a second capacitor (low voltage capacitor). The voltage sensing capacitor and the second capacitor on the PCB could be used as a voltage divider as mentioned above.

It is also possible that the voltage sensing device according to the invention provides a signal cable. The signal cable could either directly be contacted to the radially outer electrode and establish an electrical connection between the radially outer electrode and a PCB, which would be arranged outside of the high and/or medium voltage environment. According to another embodiment it is also possible that the PCB is arranged on the radially outer electrode—as mentioned above—and that the signal cable which is connected to the PCB is used to transmit measured signals.

According to another embodiment, the voltage sensing device extends at least partially or entirely around the circumference of the power carrying conductor. Different possibilities relating to this embodiment have been described above. If it only extends partially around the circumference of the power carrying conductor, it may be necessary to provide additional means—as described above—for holding the radially outer electrode in place relatively to the radially inner electrode.

The voltage sensing device may be integrated into a cable accessory, such as for example a termination, a splice or a t-body. This constitutes a space saving arrangement of the elements of the sensor. The voltage sensing device may also comprise two or more shells, engageable with each other to form a voltage sensing device having a tubular shape. This may allow the voltage sensing device to be arranged around a power carrying conductor at a longer distance from an end of the power carrying conductor. The voltage sensing device may also comprise one piece only and be mounted by being placed over a cable end.

The voltage sensing device may also be designed such that it can easily be attached and fixed to a cable termination. The connection between the cable termination and the voltage sensing device needs to be designed such that an electrical connection between the conductive cable end and the radially inner electrode is established. The fixation may be conducted with known mechanical elements, such as for example a screw nut, or a bolt or by using a conductive adhesive.

The invention also comprises a cable connector for a high and/or medium voltage power carrying conductor, the cable connector comprising a conductive element adapted to electrically connect the cable connector to an electrode of the voltage sensing device described above.

The invention also relates to a cable accessory comprising a voltage sensing device described above.

Figure 2:
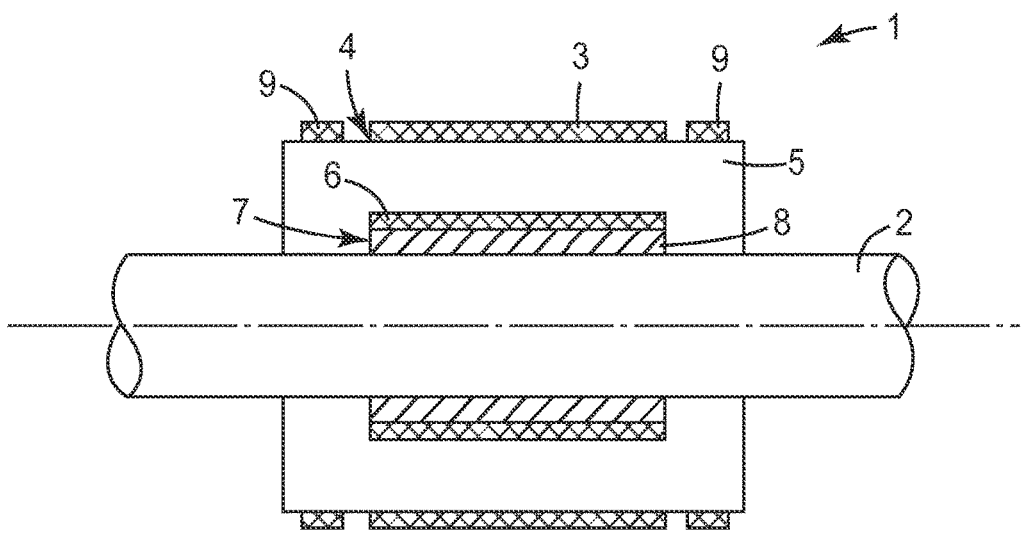
Figure 3:
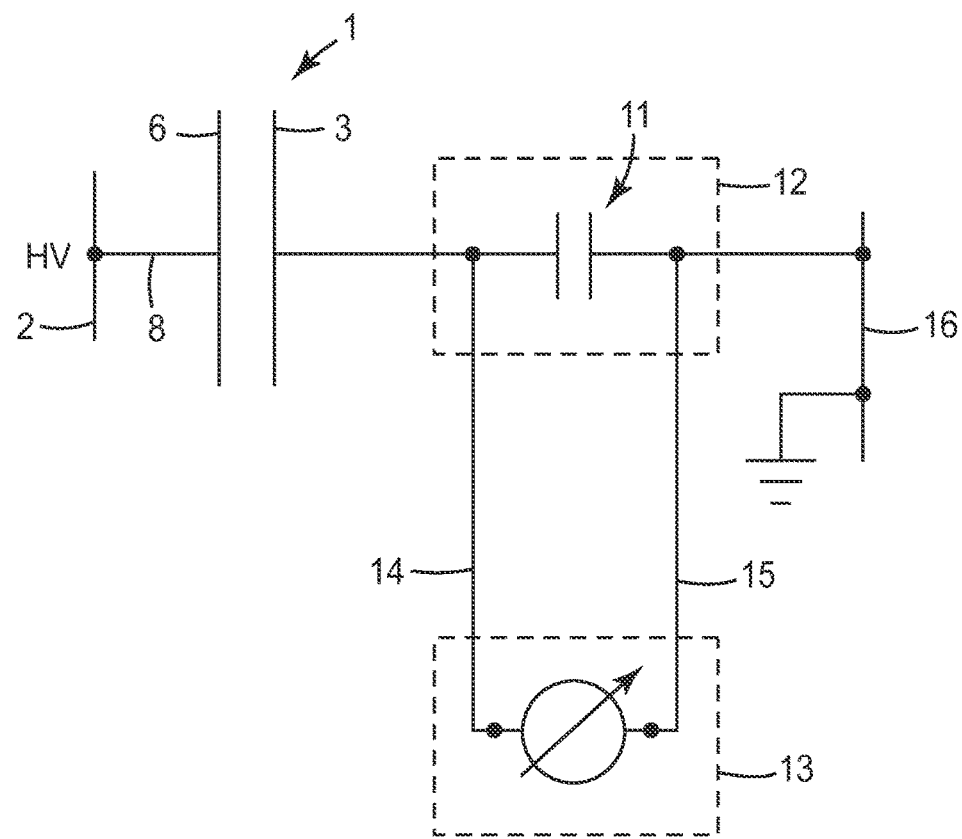
Figure 4:
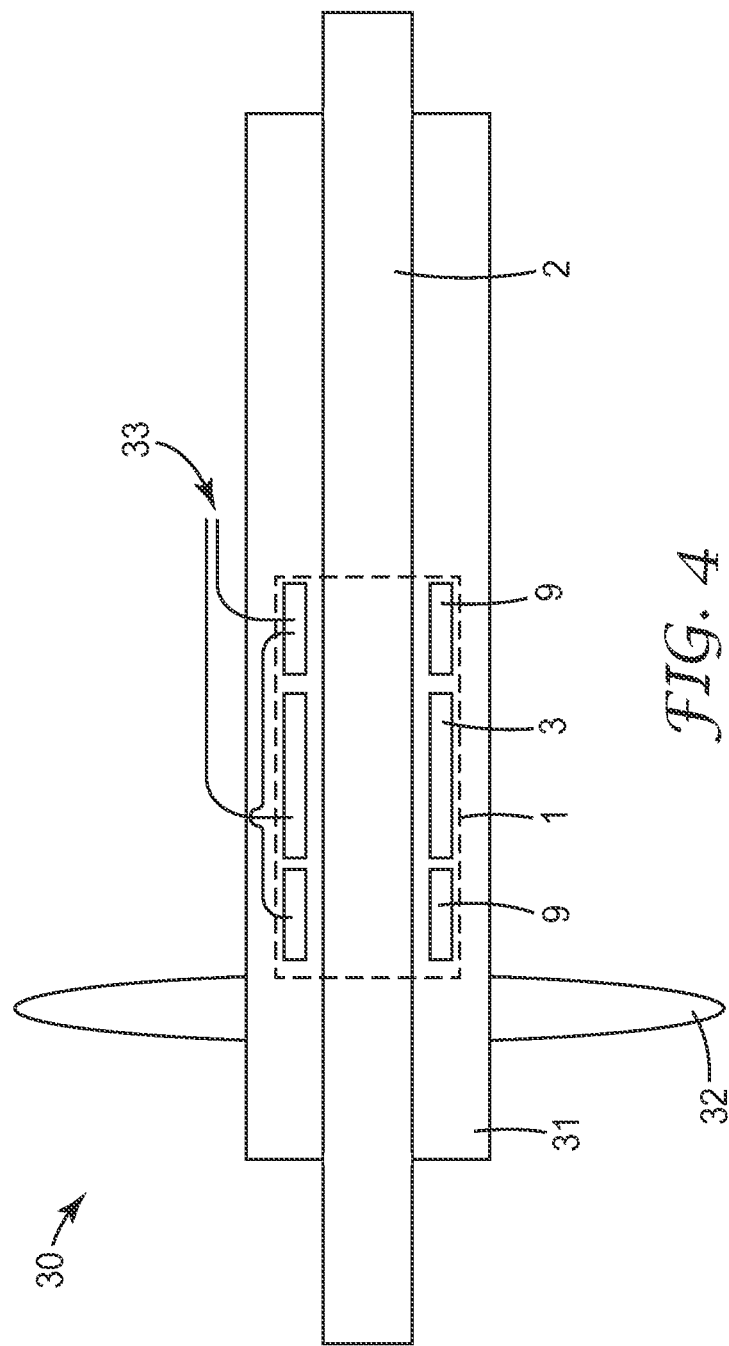
Figure 5:
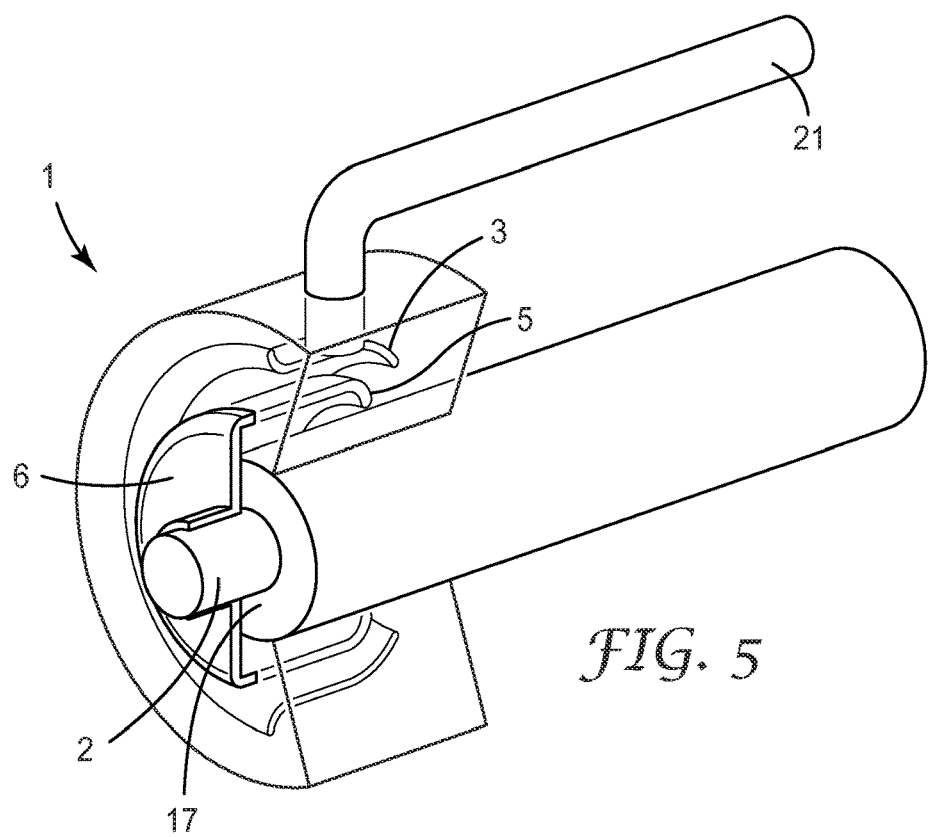
Figure 6:
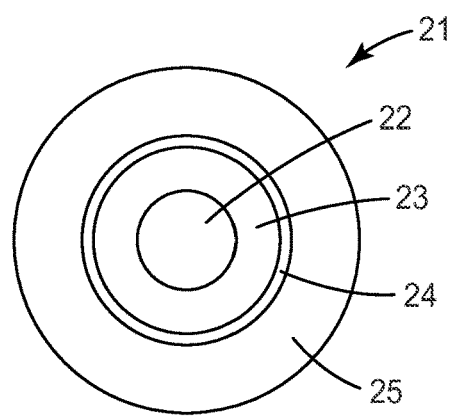

The invention will now be described in more detail with reference to the following Figures exemplifying particular embodiments of the invention:

FIG. 1 a cross-sectional view of one embodiment of a voltage sensing device according to the invention;

FIG. 2 a cross-sectional view of another embodiment of a voltage sensing device according to the invention;

FIG. 3 an electrical circuit diagram of a voltage sensing device according to the invention;

FIG. 4 a cross-sectional schematic view of a voltage sensing device according to the invention integrated into a cable accessories;

FIG. 5 a three-dimensional view of another embodiment of a voltage sensing device according to the invention and FIG. 6 a cross-sectional view of a signal cable of the voltage sensing device shown in FIG. 4.

Herein below various embodiments of the present invention are described and shown in the drawings wherein like elements are provided with the same reference numbers.

FIG. 1 shows a cross-sectional view along the longitudinal axis of a power carrying conductor 2 of one embodiment of a voltage sensing device 1 according to the invention. The power carrying conductor 2 is the inner power carrying conductive part of a high and/or medium voltage cable. The voltage sensing device 1 comprises a radially outer electrode 3, that is cylindrically shaped and comprises a passageway 4 with a circular cross section. Within this passageway 4 a cylindrically shaped dielectric material 5 is arranged. The radially outer electrode 3 may for example be made out of aluminum, copper or steel. The dielectric material may for example be made out of silicone rubber.

In order to provide a voltage sensing device 1 that can provide measuring results of high accuracy the dielectric material 5 may be attached to the radially outer electrode 3 by means of an adhesive or an adhesion promoter. This helps to avoid air bubbles in the electrical field and holds the dielectric material in place when changing temperatures may affect the geometry of the components of the voltage sensing device.

If the dielectric material is silicone rubber, e.g. which has no or very little adhesion to metal, a suitable adhesive that could be used is Scotch™ 1619 silicone sealing material, commercially available from 3M Germany GmbH in Neuss, Germany. One way of attaching the dielectric material to e.g. the radially outer electrode is to apply the Scotch™ 1619 silicone sealing material to the inner surface of the radially outer electrode and cure it in an oven at approximately 60° C. for about 15 minutes or longer. The dielectric material, e.g. the silicone rubber, can then be injection molded or cast onto or into the prepared metal part. By using this specific sealing material it is possible to create a continuously high adhesion between the radially outer electrode and the dielectric material that is higher than the tensile strength of the silicone rubber. Other known adhesion promoters or bonding agents may be used as well.

FIG. 2 shows a cross-sectional view along the longitudinal axis of a power carrying conductor 2 of another embodiment of a voltage sensing device 1 according to the invention. The power carrying conductor 2 may be the power carrying conductor of a high and/or medium voltage cable. The conductor 2 can as well be a metal rod that is attached to the conductor of a cable. The voltage sensing device 1 comprises a radially outer electrode 3, that is cylindrically shaped and comprises a passageway 4 with a circular cross section. Within this passageway 4 an also cylindrically shaped dielectric material 5 is arranged. The radially outer electrode 3 may for example be made out of aluminum, copper or steel. The dielectric material may for example be made out of silicone rubber.

The embodiment shown in FIG. 2 also provides a separate element between the power carrying conductor and the dielectric material operable as the radially inner electrode 6, that is cylindrically shaped and comprises a passageway 7. Within this passageway 7 the power carrying conductor 2 is arranged. The embodiment shown in FIG. 2 also provides a contact element 8 that is arranged within the passageway 7 and between the power carrying conductor 2 and the radially inner electrode 6. The contact element 8 electrically connects the power carrying conductor 2 with the radially inner electrode 6. The radially inner electrode may for example be made out of aluminum, copper or steel and the contact element may for example be made out of a conductive silicone. To attach the dielectric material to the radially inner electrode the same adhesives, adhesion promoters or bonding agents and the same process as described above with reference to FIG. 1 can be used.

The embodiment shown in FIG. 2 also provides on each side of the radially outer electrode 3 a stress control element 9. The stress control elements 9 may have a ring shape and may be made out of aluminum, copper, steel or conductive paint or the same material as the radially outer electrode 3. The stress control elements 9 may be used to prohibit a stray field in the area of the edges of the radially outer electrodes.

The arrangements shown in FIG. 1 or FIG. 2 may for example be overmolded with silicone material.

Possible arrangements for voltage sensing devices 1 shown in FIG. 2 may provide a radially inner electrode out of aluminum overmolded by 8 silicone, e.g. Powersil 600, and a radially outer electrode out of aluminum. Another example is a radially inner electrode out of aluminum overmolded by 8 mm silicone and a radially outer electrode of boron nitride. Another example is a radially inner electrode out of aluminum overmolded by 9 mm silicone and a radially outer electrode out of brass CuZn37. Yet another example for a voltage sensing device 1 shown in FIG. 2 is a radially inner electrode out of aluminum overmolded by 10 mm silicone and a radially outer electrode out of stainless steel (e.g. 1.4878 or 1.4301). All other combinations of materials are possible as well.

FIG. 3 is an electrical circuit diagram of a voltage sensing device 1 according to the invention. The sensing capacitor 1 has a radially outer electrode 3 and a radially inner electrode 6. The radially inner electrode 6 is electrically connected over a contact element 8 with a power carrying conductor of a high- and/or medium voltage power network. The sensing capacitor 1 is electrically connected in series with a secondary capacitor 11, so that the sensing capacitor 1 and the secondary capacitor 11 can be operated as a capacitive voltage divider. The secondary capacitor 11 may be arranged on a printed circuit board (PCB) element 12. The PCB element 12 may be arranged very close to the voltage sensing device 1, even in direct contact with the radially outer electrode 3. In that case, the electrical contact between the PCB element 12 and the radially outer electrode 3 may be made via an exposed conductive region of the PCB element. Alternatively the PCB element 12 may be arranged at a distance from the voltage sensing capacitor 1 and electrically connected to the radially outer electrode by for example a wire. Electrically the secondary capacitor 11 is connected on one side to the voltage sensing capacitor 1 and on the other side to ground.

Because the power carrying conductor 2 is electrically connected to the radially inner electrode 6 via the contact element 8, measuring the voltage of the power carrying conductor 2 can be done by measuring the voltage of the radially inner electrode 6. The voltage of the radially inner electrode 6 of the voltage sensing device 1 versus ground is measured by measuring the voltage across the secondary capacitor 11. The secondary capacitor is therefore electrically connected to a measurement device 13 via a sensor wire 14 and a ground wire 15. The measurement device 13 is electrically connected in parallel to the secondary capacitor 11 via the sensor wire 14 and the ground wire 15. The measurement device 13 is electrically connected to ground via a conductive or semi-conductive element 16.

In the capacitive voltage divider described above, the voltage of the power carrying conductor 2 is sensed by measuring a voltage across the secondary capacitor 11. Alternatively, the voltage of the power carrying conductor 2 can be sensed by measuring a current through the voltage sensing device 1.

FIG. 4 is a cross-sectional, schematic view of a voltage sensing device 1 according to the invention, integrated into a cable accessory 30. The cable accessory 30 comprises a power carrying conductor 2 and an isolation 31 with a skirt 32. The voltage sensing device 1 according to the invention, which is integrated into the isolation 31 of the cable accessory may comprises all components described with reference to FIGS. 1 and/or 2, which are a sensing electrode 3, optionally two stress control elements 9 on both sides of the sensing electrode 3. It may also comprise a radially inner electrode, which may either be the power carrying conductor itself or a separate electrode element 6 as illustrated in FIG. 2. The voltage sensing device 1 shown in FIG. 4 also comprises electrical connections (cable) 33 to electrically connect the voltage sensing device 1 e.g. with a low voltage capacity.

FIG. 5 is a three-dimensional view of another embodiment of a voltage sensing device 1 according to the invention. This embodiment is for use with a cable termination, that provides a power carrying conductor 2 and an insulation layer 17 extending around the power carrying conductor.

The voltage sensing device 1 according to this embodiment comprises a radially inner electrode 6 as well as a radially outer electrode 3. Between the two electrodes 6 and 3 a dielectric material 5 is arranged. The two electrodes 6 and 3 may be made out of the same material, which may be all the materials listed in the general part of the description. The electrodes 6 and 3 may also be made out of different materials or material combinations. The dielectric material 5 may be a silicone or a Polyethylene or any other non-conductive material, e.g. those mentioned in the general part of the description. It is possible to mold the dielectric material 5 between and around the two electrodes 6 and 3. It is also possible to fix the dielectric material to one or both electrodes by using any of the above mentioned adhesives, bonding agents or adhesion promoters.

The radially inner electrode 6 is directly connected to the power carrying conductor 2, which may for example be shaped like a lug. All other known shapes of the end of the power carrying conductor are possible as well. The radially outer electrode 3 is electrically separated from the radially inner electrode 6 by means of the dielectric material 5. The dielectric material needs to provide a dielectric strength that is high enough to withstand the high- and/or medium voltage.

The embodiment shown in FIG. 5 is a voltage sensing device 1 that does only partially extend around the power carrying conductor. It is also possible to provide an equivalent embodiment as shown in FIG. 5 extending completely around the power carrying conductor.

The radially outer electrode 3 may provide a printed circuit board (not shown in FIG. 5), which is electrically connected to the radially outer electrode 3 and which may comprise a low voltage capacity. The voltage sensing device 1 and the low voltage capacity of the PCB element 12 can be electrically connected to a circuit shown in FIG. 3.

A high voltage signal cable may be connected to the PCB element 12 in order to transmit measured data out of the high voltage area and to bring earth potential to the PCB element 12. It is also possible to electrically connect one end of the high voltage signal cable to the radially outer electrode 3 and the other end to a PCB, which in this case would be located in a low voltage environment.

The electrodes are shaped in a special high voltage manner with round edges to keep the electrical field strength in the molded dielectric body below the limits of the used material.

The high voltage signal cable is shown in a cross section in FIG. 6. The high voltage signal cable must be designed such, that it can be used in a high voltage environment. Therefore it provides a high voltage insulation 25 at its radial outer side. Below this insulation a conductive screen on earth potential is placed 24. An additional insulation 23 is foreseen under the metallic screen and inside a conductor 22 is placed. The high voltage signal cable needs to be connected to the PCB element 12 and/or the radially outer electrode 3 in such a way as to withstand the high and/or medium voltage.

The benefit of the voltage sensing device according to this embodiment is, that it easily can be placed at the end of a cable without having the need to have to take away any insulation.

The invention claimed is:

1. Voltage sensing device for a power carrying conductor, the voltage sensing device comprising:
    a radially outer electrode operable as a first sensing electrode of a sensing capacitor for sensing the voltage of the power carrying conductor;
    a radially inner electrode operable as a second sensing electrode of the sensing capacitor;
    a dielectric material arranged between the inner and the outer electrode, and
    a contact element electrically connecting the power carrying conductor with the radially inner electrode,
    wherein the coefficient of thermal expansion of the material of at least one electrode is selected such that it compensates the temperature dependent parameters of the dielectric material and/or the other electrode, that influences the capacity of the voltage sensing capacitor.

2. Voltage sensing device according to claim 1, wherein the inner electrode comprises a portion of the power carrying conductor.

3. Voltage sensing device according to claim 1, wherein the inner electrode comprises a separate electrode element which is placed between the power carrying conductor and the radially outer electrode.

4. Voltage sensing device according to claim 1, wherein either one or both electrodes are arrangeable around the power carrying conductor.

5. Voltage sensing device according to claim 1, wherein the coefficients of thermal expansion of the materials of the radially outer and the radially inner electrode are selected such that they compensate the temperature dependent parameters of the dielectric material and/or the other electrode, that influences the capacity of the voltage sensing capacitor.

6. Voltage sensing device according to claim 1, wherein the radially inner electrode is made out of a material with a higher coefficient of thermal expansion than the coefficient of thermal expansion of the material of the radially outer electrode.

7. Voltage sensing device according to claim 1, comprising at least one grounded stress control element arranged adjacent to at least one edge of the radially outer electrode.

8. Voltage sensing device according to claim 1, wherein the outer edges of the radially inner and/or radially outer electrode are shaped such as to minimize the strength of the electrical field in the area of the electrode edges.

9. Voltage sensing device according to claim 1, comprising a printed circuit board (PCB) with a low voltage capacity arranged on and electrically contacted with the radially outer electrode.

10. Voltage sensing device according to claim 1, comprising a signal cable contacting the radially outer electrode with a PCB.

11. Voltage sensing device according to claim 1, wherein the voltage sensing device extends at least partially or entirely around the circumference of the power carrying conductor.

12. Voltage sensing device according to claim 1, wherein the voltage sensing device is integrated into a cable accessory.

13. Voltage sensing device according to claim 1, wherein the voltage sensing device is designed such that it can easily be attached to a cable termination.

14. Cable accessory comprising a voltage sensing device according to claim 1.

15. Voltage sensing device according to claim 1, wherein the contact element comprises conductive silicone disposed between the radially inner electrode and the power carrying conductor.

* * * * *